United States Patent

Totah et al.

[15] 3,654,000

[45] Apr. 4, 1972

[54] SEPARATING AND MAINTAINING ORIGINAL DICE POSITION IN A WAFER

[72] Inventors: Raymond P. Totah; Gordon L. Hawkins, both of Costa Mesa; Peter H. Soo, Huntington Beach; George Wolfe, Jr., Newport Beach, all of Calif.

[73] Assignee: Hughes Aircraft Company, Culver City, Calif.

[22] Filed: Apr. 18, 1969

[21] Appl. No.: 817,440

[52] U.S. Cl. ....................156/17, 156/236, 29/578

[51] Int. Cl. ....................H01l 7/50

[58] Field of Search ....................156/17, 236; 29/578

[56] References Cited

UNITED STATES PATENTS 3,423,255 1/1969 Joyce....................29/578

3,335,338 8/1967 Lepselter....................317/234

3,423,823 1/1969 Ansley....................29/578

3,494,023 2/1970 Dorendorf....................29/578

OTHER PUBLICATIONS

Assembling Beam-Lead Sealed-Junction Integrated Circuit Packages by Eleftherion, The Engineer, Dec. 1967, pp. 16- 18

*Primary Examiner*—Jacob H. Steinberg
*Attorney*—James K. Haskell and Paul M. Coble

[57] ABSTRACT

A wafer of silicon material containing semiconductor devices on its front side has an oxide coating on its back side. The back side is masked and aligned in conformity with the devices on the front side. The oxide is selectively etched and the remaining oxide serves as a mask for etching through the semiconductor material. The devices are retained in relative position throughout the separation steps.

5 Claims, 5 Drawing Figures

Patented April 4, 1972 3,654,000

Raymond P. Totah,
Gordon L. Hawkins,
Peter H. Soo,
George Wolfe, Jr.,
INVENTORS.
BY.
J. K. Haskell
ATTORNEY.

SEPARATING AND MAINTAINING ORIGINAL DICE POSITION IN A WAFER

BACKGROUND

It is common in the present art to form a plurality of semiconductor devices on one side of a wafer of semiconductor material, and to separate the wafer into a plurality of dice, each having a semiconductor device thereon. However, the separation method presently employed is the scribing of lines between the devices, to define individual dice along the scribe lines, and then to break the semiconductor into the individual dice. Of course, such mechanical scribing and breaking results in rough edges, which are not dimensionally satisfactory.

SUMMARY

In order to aide in the understanding of this invention, it can be stated in essentially summary form that it is directed to a process for separating semiconductor devices from a wafer, and particularly the etching of a wafer having a plurality of semiconductor devices thereon in such a way as to separate the wafer into various portions in accordance with the character and positioning of the semiconductor devices thereon. The process includes the steps of positioning a mask in accordance with device position, followed by etching, so that the etching step at least substantially separates the devices. The process also requires the maintenance of relative dice position for further handling.

Accordingly, it is an object of this invention to provide a process for the etching of semiconductor devices, and particularly to etch a wafer having a plurality of semiconductor devices thereon into individual dice, or the like. It is another object to position a mask in accordance with device positioning on the chip so that etching takes place at such a location as to separate the devices. It is still another object to provide a process for etching a wafer carrying a plurality of semiconductor devices into dice, each carrying a separate device, particularly where the semiconductor wafer material is silicon, and the silicon is coated on one side with a layer of silicon dioxide, including the steps of examining device positioning by infrared techniques through the wafer, and etching the layer of silicon dioxide in accordance with device positioning, followed by etching of the semiconductor material layer. It is another object to maintain the dice in relative position during and immediately after separation, for further processing. Other objects and advantages of this invention will become apparent from a study of the following portion of the specification, the claims and the attached drawings.

DESCRIPTION

Figure 3:
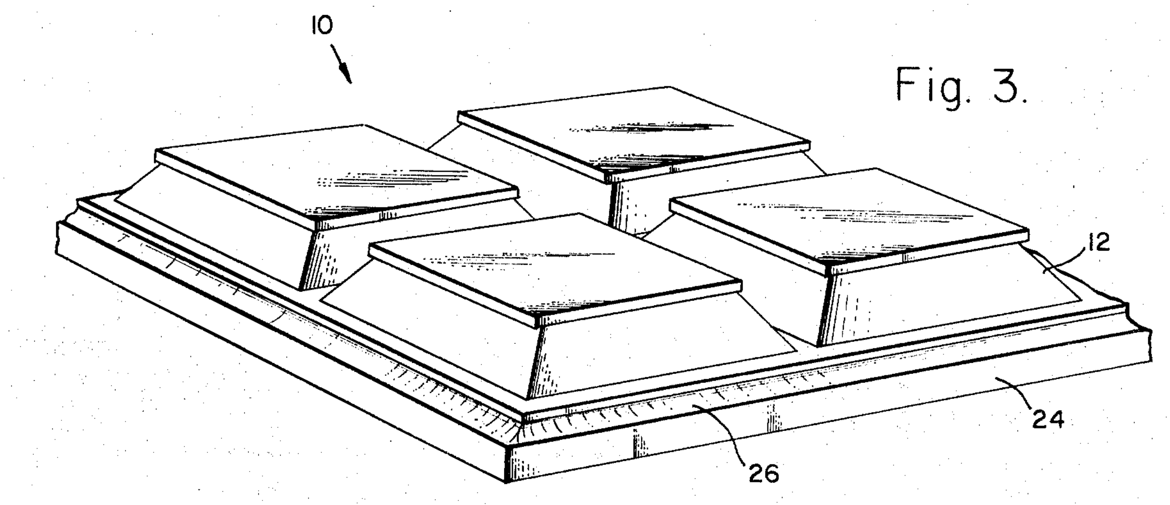
FIG. 3 is an isometric view of the structure of FIG. 2.
Figure 1:
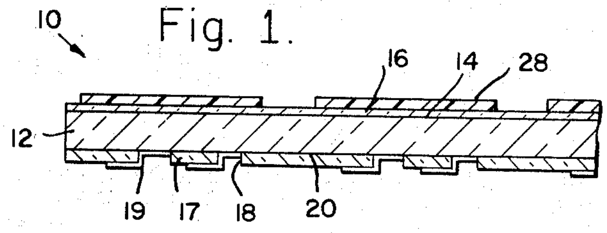
FIG. 1 is a section taken through a plurality of semiconductor devices on a wafer of semiconductor material, showing the first step of masking the area to be etched, in alignment with the devices upon the opposite side of the wafer
Figure 2:
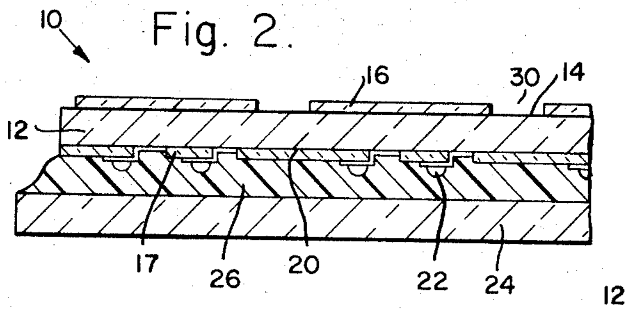
FIG. 2 is a similar section showing the results of the first etch with the masking material removed and the wafer supported.
Figure 4:
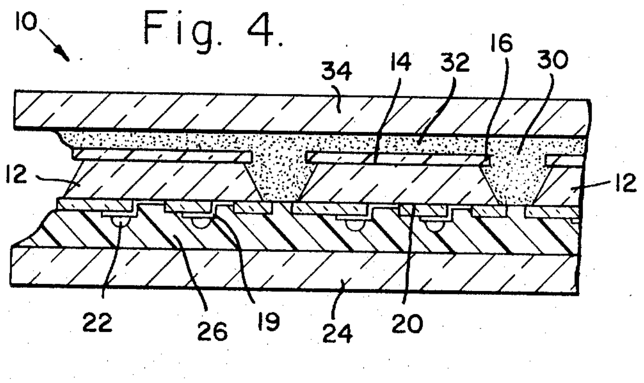
FIG. 4 is a section similar to FIG. 2 showing the results of a second etch and showing support of the dice on both sides of the wafer.

Referring to the drawings, a discrete semiconductor die having a semiconductor device on at least one side thereof is indicated at 10. A plurality of such semiconductor devices are formed upon and from a monocrystalline layer 12 of semiconductor material. In the present example, the material is elemental silicon, cut from a single crystal, and cut so that the horizontal plane, perpendicular to the drawings in FIGS. 1, 2, 3 and 5, and parallel to the top plane of the perspective of FIG. 4, is an oriented silicon epitaxial wafer having 1–0–0 orientation with the flat cut parallel to the 1–1–0 orientation. The silicon has impurities so that it is either p or n-type material. The steps which produce discrete dice are as follows. First, the back 14 of the epitaxial wafer 12 is polished so that a smooth oxide layer results. Back oxide layer 16 is formed. This oxide layer is of silicon dioxide of about 12,000 Angstroms thick on a silicon epitaxial wafer 0.006 inches thick, for example.

Devices are formed at front surface 20 by established processes. During such formation, the front oxide layer 17, with openings 18 therein, is formed, together with interconnects 19. Interconnects 19 extend from the front surface 20 of layer 12 to the top of front oxide layer 17. In the art, the term "devices" means those semiconductor arrangements which can be employed in electric signal processing. The devices can be fabricated by any convenient, known means, including diffusion or implantation. Examples of diffusion processes are given in the following patents:

William Shockley: 2,937,114; May 17, 1960
Walter E. Mutter: 3,319,311; May 16, 1967
Jack L. Langdon: 3,389,023; June 18, 1968
Peter T. Robinson: 3,394,037; July 23, 1968.

Additionally, the devices can be fabricated by implantation techniques, if so desired, of which the following patents are examples:

James O. McCaldin, et al.: 3,328,210; June 27, 1967
Claud M. Kellett: 3,341,754; Sept. 12, 1967
Kenneth E. Manchester: 3,390,019; June 25, 1968.

After the device creation, interconnect metallization is deposited and processed to a pre-established pattern. These steps are also known in the art, and include the formation of protuberances 22, on interconnects 19, by which the devices are ultimately electrically connected to the remainder of the circuit of which they are a part. Thus, as far as the individual semiconductor device is concerned, the work is complete, except for the separation of the devices into individual dice which may carry individual semiconductor devices, but preferably carry a plurality thereof in the form of an integrated circuit.

In order to accomplish such division or separation of the wafer into dice, the first step is to apply photoresist 28 to back oxide layer 16 so that a suitable pattern can be indicated upon the photoresist for ultimate etching. The photoresist is ready for exposure, but the exposure must be such as to align the grid etch pattern in the photoresist, on the back side of the device, so that the device boundaries on the front side are coordinated therewith. In other words, the wafer must be separated along such lines that the various dice are maintained and not inadvertently divided through an integral part thereof. The alignment step comprises employing infrared to look through the wafer, and by means of examining the positioning of the interconnects thereon, on the front oxide layer 18, correctly orienting the dividing grid pattern on the back side so that the device boundaries are defined by the grid pattern on the back side.

After establishment of the grid pattern, the next step is the etching of the back oxide layer 16. This is accomplished by any standard photoresist buffered etch material, which is useful and adequate for the etching of the silicon dioxide layer. The usual etch used in such cases is a buffered hydrofluoric acid etch, which is buffered with ammonium fluoride to excess. It is employed at room temperature, and has an etch rate of about 800 Angstroms per minute. A sufficient length of etch time is allowed to etch out an open space 30 in the back oxide layer 16. Since the silicon dioxide layer is about 12,000 Angstroms thick, and the etch is about 800 Angstroms per minute, an appropriate length of time of etch is 15 minutes.

Next, the wafer is washed. The next etching step comprises the separation of the semiconductor layer 12 by etching. In order to prevent the dice from separating, it is necessary to mount the semiconductor wafer upon a substrate, such as glass plate 24 by means of a suitable wax 26. While the term "-wax" is employed, it is understood that it is employed generically to a material which suitably supports the semiconductor wafer upon the substrate. Such material must not affect the semiconductor wafer, or the interconnects thereon, and is removable therefrom. Accordingly, any adhesive which properly supports the wafer and is later removable without damage to the wafer or dice is satisfactory.

The opening 30 is in line with the original etch area through photoresist 28, and thus is directly related to the positioning of the devices on the opposite side. Accordingly, the spaces 30 are employed as resist openings, after the photoresist is removed, for the next etching step through layer 12. Potassium hydroxide is the etchant for this step. An etch solution of 250 grams of potassium hydroxide in 850 cc. of water is employed. This makes the potassium hydroxide solution of about 25 percent by weight solution of the hydroxide in water. It is employed at 82° C., ± 2° C., by placing the semiconductor wafer in the solution. The device side is protected by the layer of wax 26, which, it should also be noted, is resistant to both etch solutions. The silicon dioxide layer 16 on the back has sufficient resistance to the potassium hydroxide etch that, at the conditions indicated, the silicon layer 12, which is 0.006 inches thick, will be etched through while the silicon dioxide back layer 16 will be etched about halfway through. The important thing to note about this step, as the article changes from the condition of FIG. 2 to the condition of FIG. 3, is that the silicon metallic layer 12 becomes completely divided so that the only interconnection is in the front silicon dioxide layer 18, plus of course, the temporary supporting substrate 24 with its wax layer 26. Thus, the dice are electrically separated.

Due to the employment of an epitaxial silicon wafer cut and polished in the 110 plane, the angle of the facet is fixed, in accordance with crystallographic principles. Thus, the dimensions at the bottom of the etched channel or space are controlled by the dimensions of the oxide mask and the facet angle. The polishing of the wafer face reduces attack on the face and edges of the oxide mask to maintain accuracy.

Figure 5:
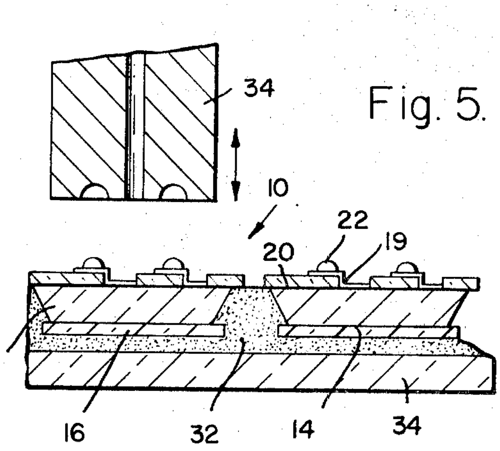
FIG. 5 is a section showing the individual dice supported in relative position and ready to be acted on for the next processing step.

As the next step, a rear support is mounted by means of moulding a support adhesive layer 32 over the rear oxide layer 16 and the openings or spaces 30 between the individual dice. A suitable rear support structure, such as a sapphire or quartz layer 34, is secured thereto by means of the adhesive, as discussed above with respect to wax layer 26. One of the requirements is that the layer 32 on the rear of semiconductor device 10 be of such nature as to separate under different conditions than the layer 26. Thus, after attachment of the rear supporting material, layer 26 is removed, followed by removal of plate 24, which may be quartz or glass. Thus, the series of dice is still maintained in the interrelationship of the original matric for the next operational step. When the dice are individually separated, a handwork step is necessary to properly orient them. However, since they are in original matrix form, they can next be operated upon without handwork orientation. FIG. 5 shows the dice in vertical with the support 24 and its adhesive 26 removed. However, it is convenient to handle a plurality of these dice at the same time, and it is important to maintain their relationship in the same matrix so that the dice can be automatically tested in the same orientation. The dice are still in the matrix relationship, but are separated because the oxide layer 17 is very brittle. Lifter 34 can successively engage the dice from the matrix and move them to the next step. In view of the small size of the dice, it is convenient to next mount them in a suitable carrier, and then carry them to test and use.

By employment of the epitaxial silicon wafer having a 1–0–0 oriented silicon structure, and flat cut parallel to the one 1–1– orientation, etching from the side indicated produces a known etching characteristic and angle orientation. The total included angle between the metallic silicon of adjacent dice is 55°. Thus, etching toward the device side can be accomplished without fear of etching away necessary silicon, which would then interfere with the operation of the devices being constructed.

This invention having been described in its preferred embodiment, it is clear that it is susceptible to numerous modifications and embodiments within the ability of those skilled in the art and without the exercise of the inventive faculty.

What is claimed is:

1. A process for producing a plurality of semiconductor devices comprising the steps of:

a. fabricating a plurality of separate electronic devices in one face of a semiconductive wafer;

b. mounting said face of said wafer upon a first rigid support structure by means of a first adhesive subsequently removable from said wafer without damage thereto;

c. etching through portions of said wafer between said electronic devices from the opposite face of said wafer toward its said one face so as to divide said wafer into a plurality of dice portions, each portion containing at least one of said electronic devices;

d. securing a second rigid support structure to said opposite face of said wafer by means of a second adhesive distributed between said dice portions and subsequently removable from said wafer without damage thereto; and e. separating said wafer from said first support structure by removing said first adhesive, thereby leaving said dice portions removably secured to said second support structure in their exact original orientations and with their electronic devices accessibly exposed so that one or more of said devices can be removed without disturbing the remaining ones of said devices.

2. The process of claim 1 additionally including the step of separating said dice portions from said second support structure.

3. The process of claim 1, wherein said first and second adhesives are separable from said wafer under different conditions, so as to permit said first adhesive to be removed without disturbing said second adhesive.

4. The process of claim 1 wherein said etching step includes:

a. coating said opposite face of said wafer with an oxide layer;

b. masking said coated face so as to leave an etchable grid pattern thereon;

c. applying a first etchant to said masked face so as to etch through said oxide layer in a pattern corresponding to said grid;

d. removing said mask and said first etchant; and e. applying a second etchant to said layer so as to etch through the wafer in accordance with said grid pattern.

5. The process of claim 1 wherein said wafer is cut from a single crystal so that said one face has a 1–0–0 orientation.

* * * * *